United States Patent [19]

Bristol

[11] Patent Number: 4,628,254

[45] Date of Patent: Dec. 9, 1986

[54] METHOD FOR DIGITALLY MEASURING WAVEFORMS

[75] Inventor: L. Rodney Bristol, Tigard, Oreg.

[73] Assignee: Tektronix, Inc., Beaverton, Oreg.

[21] Appl. No.: 571,319

[22] Filed: Jan. 16, 1984

[51] Int. Cl.$^4$ .............................................. G01R 23/16
[52] U.S. Cl. ................................ 324/77 R; 324/121 R
[58] Field of Search ................. 324/77 R, 77 A, 77 B, 324/99 D, 121 R, 103 P, 102; 364/481, 484, 487; 340/709, 722, 734; 315/377, 1, 241 S

[56] References Cited

U.S. PATENT DOCUMENTS 4,476,432  10/1984  Olson ................................ 324/121 R

OTHER PUBLICATIONS

"On-Board Digital Processing Refines Scope Measurements", by Garuts et al., Electronics, 3/13/80, vol. 53, No. 6, pp. 105-114.

Primary Examiner—Michael J. Tokar
Attorney, Agent, or Firm—George T. Noe

[57] ABSTRACT

A method for digitally measuring waveforms is provided in which absolute and relative amplitudes and time information of electrical signals is electronically determined. A pair of cursors, which are operable in both independent and tracking modes, are used to provide alignment with reference points and selected measurement points so that the voltage difference between the cursors may be utilized by a digital voltmeter to provide the measurement data.

5 Claims, 11 Drawing Figures

METHOD FOR DIGITALLY MEASURING WAVEFORMS

BACKGROUND OF THE INVENTION

The present invention relates generally to waveform measurement methods, and more particularly to a method for digitally measuring absolute and relative amplitude and time information of electrical signals.

The conventional electronic instrument for general purpose measurement of electrical signals is the oscilloscope, which displays amplitude on the vertical (Y) axis versus time on the horizontal (X) axis. Both the vertical and horizontal axes may be operated either in calibrated or uncalibrated modes. In the calibrated mode, a predetermined amplitude units per distance deflection factor is specified; however, in the uncalibrated mode the deflection factor is variable and therefore cannot be specified with any accuracy.

Modern oscilloscopes have been provided with digital measurement techniques to improve convenience and reduce possible operator error in measuring the display scale. For example, absolute voltage and time measurements have been facilitated using a pair of cursors and a digital voltmeter to read the distance between cursors and provide a readout of the quantity. Heretofore, however, such measurements were accurate only in the calibrated deflection factor modes because the selected scale factor was used to modify the voltmeter reading.

SUMMARY OF THE INVENTION

In accordance with the present invention, a method for digitally measuring waveforms is provided in which absolute and relative amplitude and time information may be accurately presented in display form in uncalibrated deflection factor positions of the scale factor controls as well as in the calibrated positions thereof.

It is therefore an important feature of the present invention to provide an improved method of digitally measuring electrical waveforms, particularly in the uncalibrated deflection factor mode.

It is another feature of the present invention to provide a digital waveform measurement method particularly suited for waveform comparison purposes.

It is still another feature of the present invention to provide an improved method of digitally measuring voltage ratio as well as duty cycle.

It is yet another feature of this invention to provide a method of digitally measuring voltage and time parameters of an electrical test signal in absolute values when variable deflection factor controls are in a calibrated mode, and in percentage values when such controls are in an uncalibrated mode.

Other features and advantages of the present invention will become obvious to those having skill in the art upon a reading of the following description when taken in conjunction with the accompanying drawings.

DETAILED DESCRIPTION OF THE INVENTION

Figure 1:
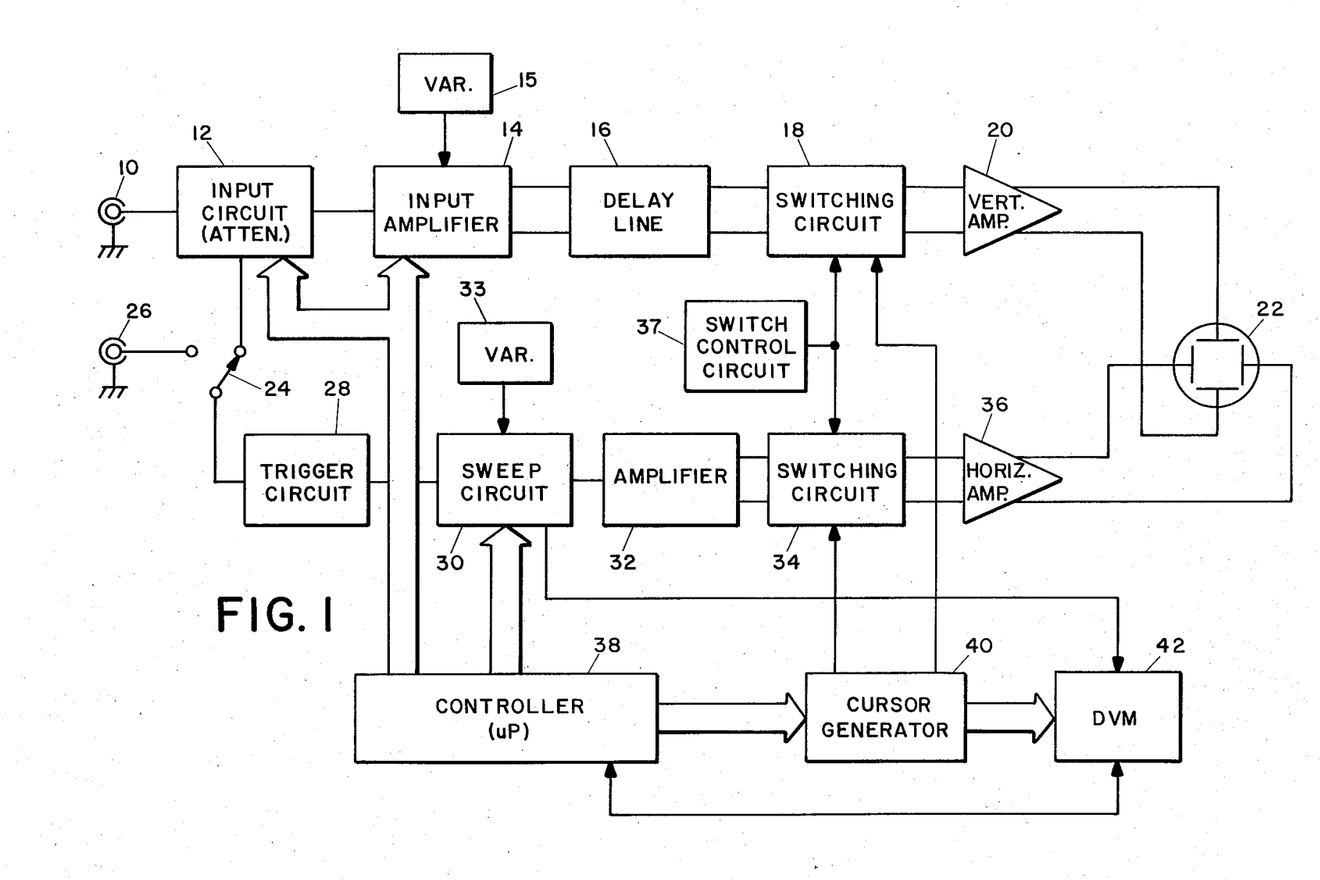
FIG. 1 is a block diagram of an oscilloscope for carrying out the measurement method of the present invention.

A block diagram of an oscilloscope to perform the digital waveform measuring method according to this invention is shown in FIG. 1. A test signal is applied to input connector 10 and is ultimately applied to the vertical deflection plates of cathode-ray tube (CRT) 22 by way of input conditioning circuit 12 including an attenuator (ATTEN.), input amplifier 14, delay line circuit 16, switching circuit 18 and vertical output amplifier 20. A part of the test signal derived from input conditioning circuit 12, or an external trigger signal applied to external trigger connector 26, is applied to trigger circuit 28 by way of trigger mode switch 24. A regenerated trigger pulse is applied to sweep circuit 30 to generate a sweep ramp signal in synchronism with the internal or external trigger signal. The sweep ramp signal is then applied to the horizontal deflection plates of CRT 22 by way of amplifier 32, switching circuit 34 and horizontal output amplifier 36. Both vertical and horizontal switching circuits 18 and 34 are under control of switch control circuit 37. The vertical input amplifier 14 is a gain controllable amplifier whose gain can be switched to either a standard deflection factor for each setting of a volts/division switch or to a variable setting between the standard deflection factors depending on the setting of variable (VAR.) control 15. The slope of the ramp signal generated by sweep circuit 30 can be switched to a standard slope for each setting of a seconds/division switch or to variable slopes between the standard settings, depending on the setting of variable control 33. Vertical sensitivity (volts/division) and horizontal time-base or sweep rate (seconds/division) are under control of controller 38 that may preferably contain a microprocessor ($\mu$P). The vertical sensitivity may be controlled by switching the attenuator in input conditioning circuit 12 and the gain of vertical input amplifier 14. The sweep rate may also be controlled by controller 38 by selecting different combinations of timing resistors and timing capacitors of sweep generator 30. Variable controls 15 and 33 may also be processed by controller 38 and an associated digital-to-analog converter to provide the required control voltages.

Cursor generator 40 generates first (reference) and second (delta) cursors under control of controller 38. The output cursor signal is selectively applied to vertical and horizontal output amplifiers 20 and 36 by way of respective switching circuits 18 and 34. Cursor generator 40 may be any conventional analog or digital design which generates a pair of vertical lines for time measurement or horizontal lines for voltage (amplitude) measurement. Each cursor may be a continuous line or non-continuous line of special dot pattern as disclosed in U.S. patent application Ser. No. 575,417, filed Jan. 31, 1984, and assigned to the assignee of the present application. As is understood by a person skilled in the art, a cursor line may be generated by applying a constant voltage to one deflection axis while applying a ramp or staircase signal to the other orthogonal deflection axis. Position of the cursor line is a function of the constant voltage applied to the one deflection axis.

Figure 2:
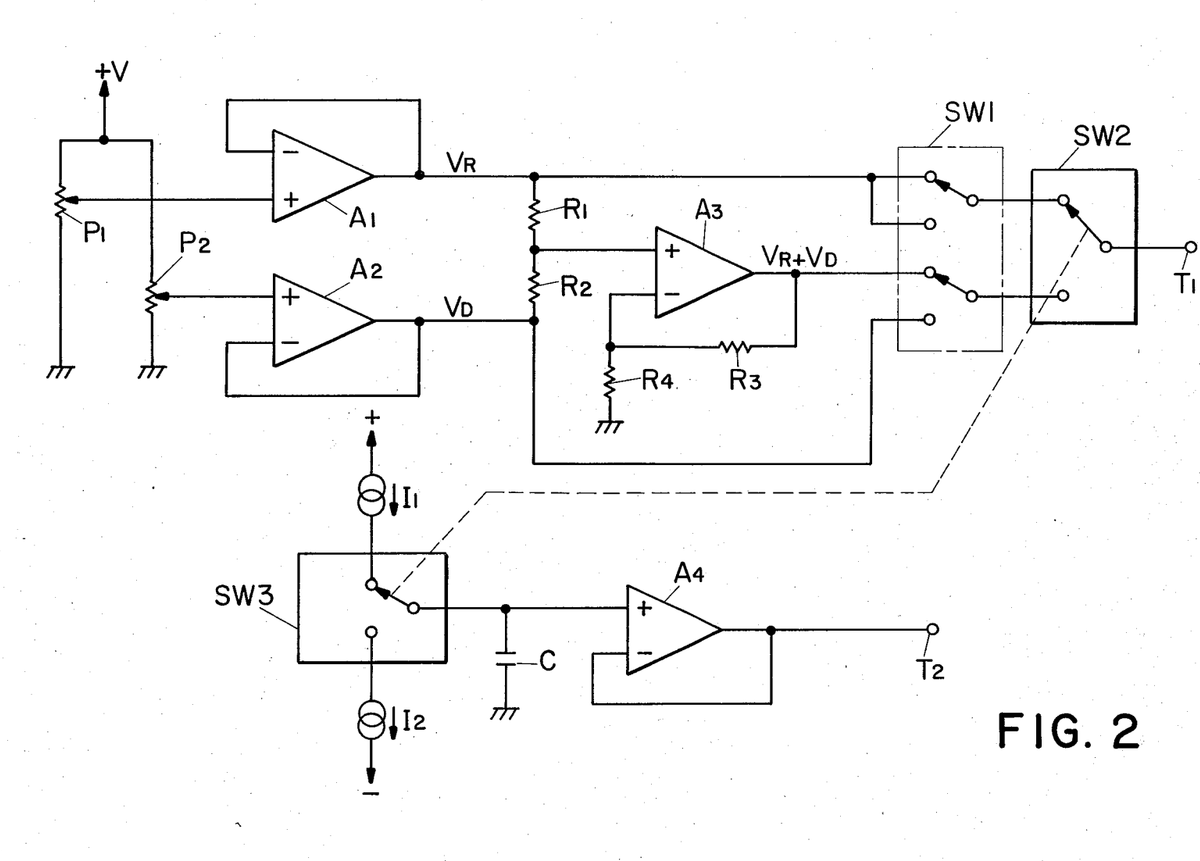
FIG. 2 is one embodiment of a cursor generator employing analog techniques.
Figure 3:
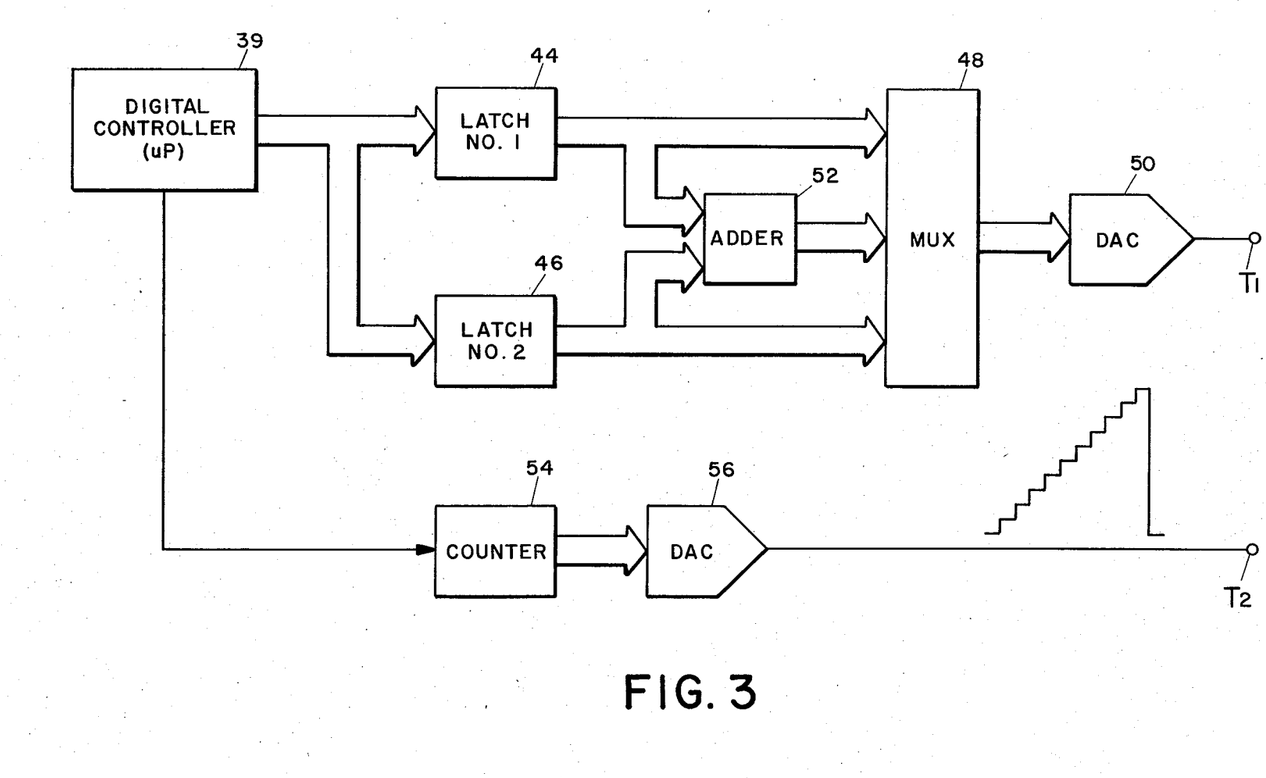
FIG. 3 is another embodiment of a cursor generator employing digital techniques.

Two examples of cursor generators, an analog type and a digital type are shown in FIGS. 2 and 3, respectively. The analog type cursor generator in FIG. 2 comprises two potentiometers $P_1$ and $P_2$, buffer amplifiers $A_1$ and $A_2$, adder $A_3$ and associated resistors $R_1$ through $R_4$ of equal resistance values, mode selection switch $SW_1$ and electronic switching circuit $SW_2$, represented in the drawing by a mechanical switch. Also included in the cursor generator is current source $I_1$, current sink $I_2$, switching circuit $SW_3$ which is similar to $SW_2$ and operationally coupled thereto, capacitor C and buffer amplifier $A_4$.

Potentiometer $P_1$ and buffer amplifier $A_1$ provide a first or reference voltage (Vr) while potentiometer $P_2$ and buffer amplifier $A_2$ provide a second or delta voltage (Vd). Such voltages Vr and Vd are applied to switching circuit $SW_2$ to be alternatively derived from first output terminal $T_1$ when mode selection switch $SW_1$ is in its lower position, indicating independent cursor operation. In this mode, both Vr and Vd are independently controlled in response to respective potentiometers $P_1$ and $P_2$, thereby functioning as lower (or left) and upper (or right) cursor line positions. Amplifier $A_3$ and its associated resistors comprise an adder to provide the sum of Vr and Vd (or Vr+Vd) at the output of $A_3$, thereby applying Vr and Vr+Vd to switching circuit $SW_2$ when mode selection switch $SW_1$ is set to the upper position, indicating cursor tracking operation. As is understood hereinafter, the tracking mode is useful in various applications when both cursor line positions are shifted simultaneously while maintaining constant distance therebetween. On the other hand, a triangle signal is derived from second terminal $T_2$ by charging capacitor C by allowing current to flow thereinto from current source $I_1$ or by discharging it through current sink $I_2$. The charging and discharging is controlled by switching circuit $SW_3$ to generate positive-going and negative-going portions of the triangle signal. Although not shown in FIG. 2, switching circuit $SW_3$ is controlled to switch whenever the output voltage at terminal $T_2$ reaches a predetermined voltage. The controllable voltage from terminal $T_1$ and the triangle voltage from terminal $T_2$ are respectively applied to the vertical (or horizontal) and horizontal (or vertical) deflection plates by way of switching circuits 18 and 34 in FIG. 1. A synchronous operation of switching circuits $SW_2$ and $SW_3$ allows the cursor generator to generate the first (or reference) cursor during the positive-going half cycle of the triangle signal and the second (or delta) cursor during the negative-going half cycle.

The digital cursor generator in FIG. 3 comprises digital control means 39 such as a µP, first and second latches 44 and 46, multiplexer (MUX) 48, adder 52, digital-to-analog converter (DAC) 50, counter 54, and another DAC 56. µP 39 provides digital data representing first and second cursor positions respectively to first and second latches 44 and 46 and also a clock pulse to counter 54. The data to first and second latches 44 and 46 may be increased or decreased by operating control levers included in digital control means 39. The latched outputs are applied to multiplexer (MUX) 48 and also applied to adder 52 before being applied to MUX 48. The selected output from MUX 48 is converted by DAC 50 into a corresponding analog voltage that is available from first output terminal $T_1$. On the other hand, counter 54 counts up or down the input clock pulses and the output is converted by DAC 56 into a staircase signal that is available from second output terminal $T_2$. Counter 54 may be recirculating so as to develop an essentially sawtooth staircase signal or may be an up/down counter to develop a triangel output. The staircase signal may be smoothed by interposing a filter network at the output of DAC 56.

In a practical embodiment, many of the abovedescribed discrete blocks are included within the microprocessor. In fact, a single DaC successively generates all controller-developed control voltages within the oscilloscope, and those voltages are distributed to a number of holding capacitors and buffer amplifiers by a demultiplexer that is controlled by the controller in synchronism with the data applied to the DAC. Moreover, counter 54 may be driven by a display control that coordinates the display of the cursors with the display of the waveform.

Now, amplitude and time measurement method according to this invention will be described hereinafter by reference to FIGS. 4A-4D.

Absolute Amplitude and Time Measurements

Figure 4A:
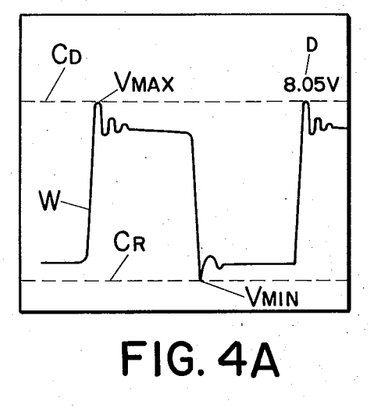
FIGS. 4A–4D are explanatory waveforms for absolute and relative amplitude and time measurement in accordance with the present invention.
Figure 5A:
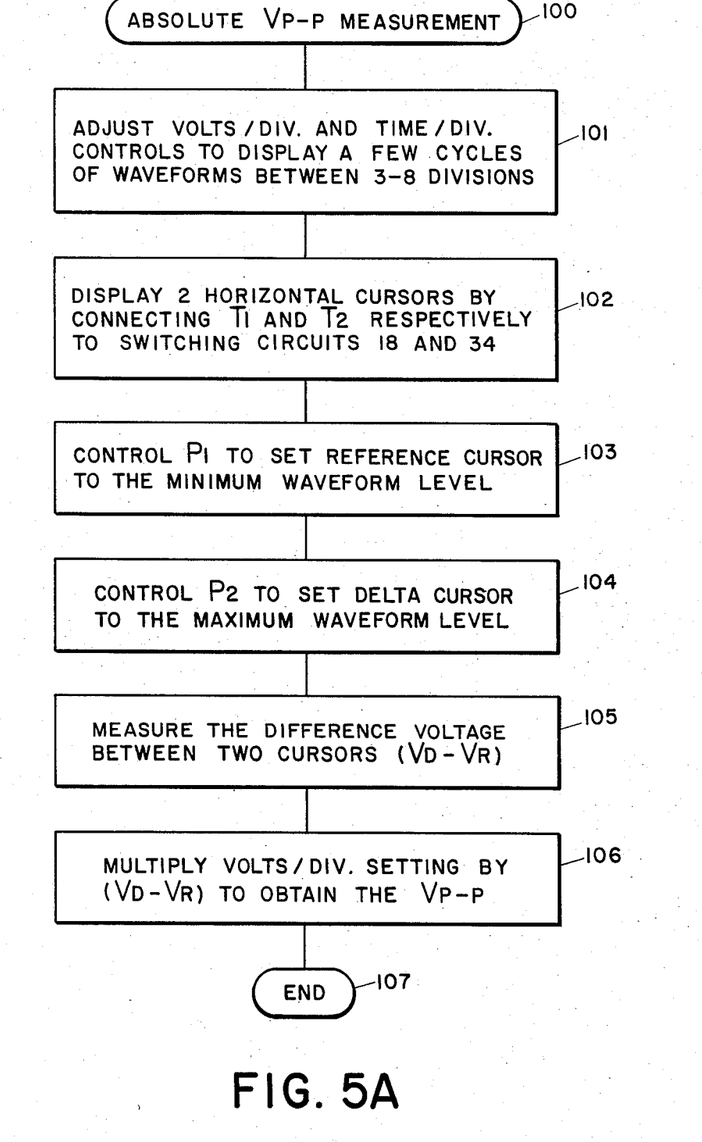
FIGS. 5A–5D are explanatory flow charts of absolute and relative amplitude and time measurement in accordance with the present invention.

Vp−p Measurement:

One typical absolute amplitude measurement is a peak-to-peak voltage (Vp−p) measurement which is shown graphically in FIG. 4A and also in FIG. 5A as a flow chart. First step 101 is to adjust the Volts/Div and Time/Div controls to display one or more cycles of waveform (W) with a convenient vertical amplitude (at lease one-third of maximum). Be sure that vertical VAR control is in its calibrated (CAL) position. Adjust the trigger LEVEL control as necessary to ensure a stable waveform on the CRT screen. Second step 102 is to display two horizontal cursor lines (reference cursor (Cr) and delta cursor (Cd) by connecting the signals on output terminals $T_1$ and $T_2$ in FIGS. 2 and 3 to switching circuits 18 and 34, respectively. Third step 103 is to control reference potentiometer $P_1$ or digital control means 39 to set reference cursor (Cr) to the minimum waveform level (Vmin). Then, delta cursor (Cd) is set to the maximum waveform level (Vmax) in fourth step 104. Fifth step 105 is to determine the separation distance between the cursors by either of two methods. The first method is by measuring the difference voltage between the two cursors (Vd−Vr) by digital voltmeter (DVM) 42 and dividing the measurement by the predetermined deflection factor of the vertical system at the cursor signal input point in volts per division. The second method to determine the distance between the cursors is by reference to previously determined calibration data within controller 38 that generates the cursors through the DAC. Sixth step 106 is to multiply the determined distance between the cursors by the volts per division setting to obtain the intended peak-to-peak voltage (Vp−p). It should be noted that the second or delta cursor in the tracking mode is equal to (Vd+Vr), and the difference voltage between the two cursor lines can be obtained by simply measuring the Vd. Vp−p measurement may be displayed at a peripheral portion d on the CRT screen or any other indicator positioned adjacent the CRT screen.

The absolute amplitude measurement technique may also be applied to absolute voltage measurement of any desired point on the displayed waveform with respect to the ground reference potential by slight modification. That is, the reference cursor is aligned with the ground reference level by connecting the input terminal 10 in FIG. 1 to ground and the delta cursor is adjusted to the intended waveform portion.

Figure 4B:
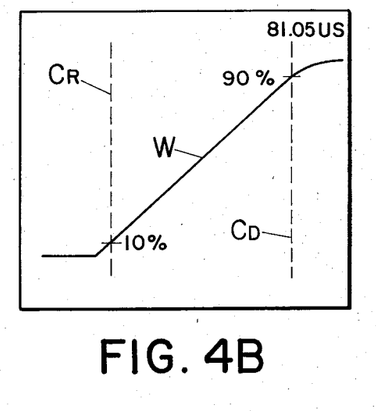
Figure 5B:
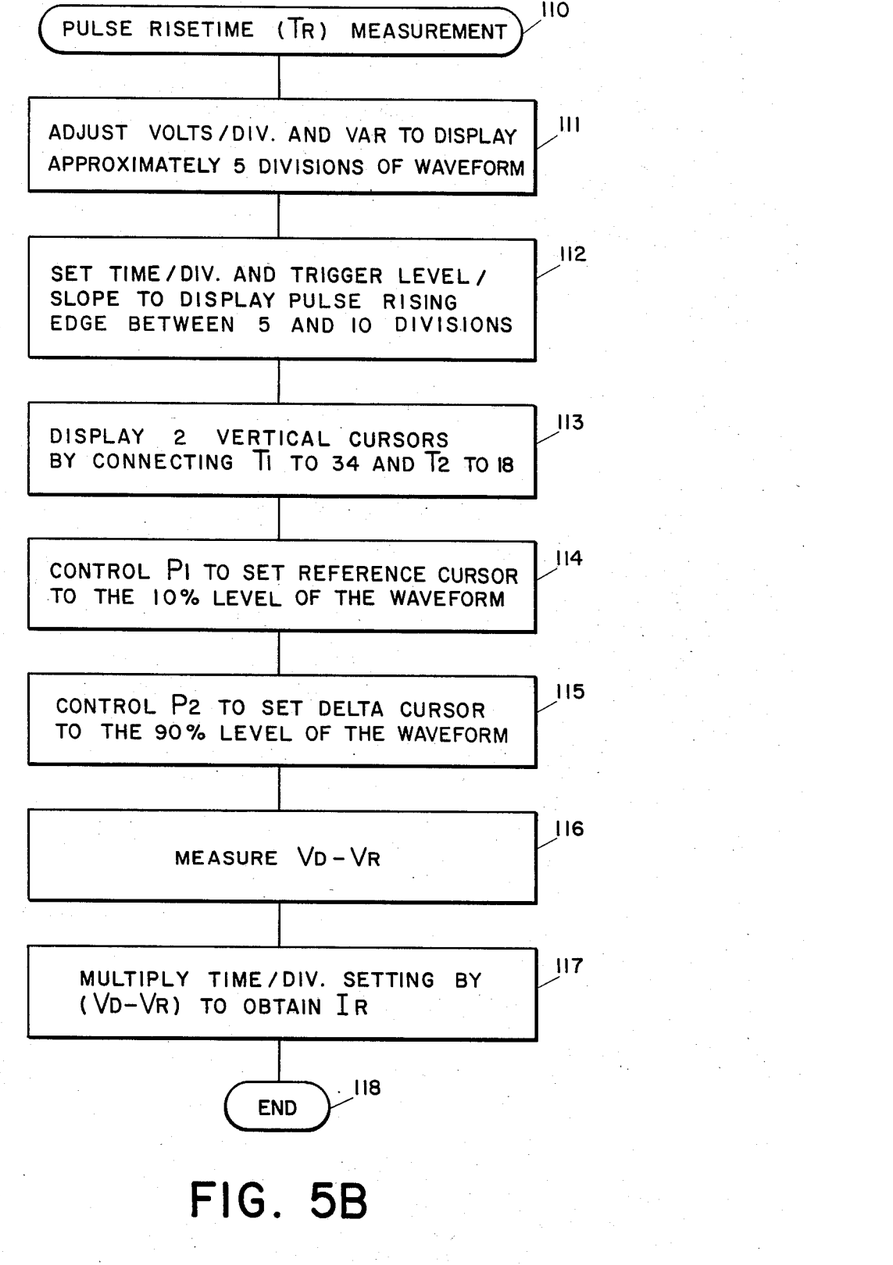

Risetime Measurement:

Pulse risetime (tr) measurement is one typical absolute time measurement and shown graphically in FIG. 4B and also in FIG. 5B as a flow chart. First step 111 is to adjust Volts/Div and, if necessary, VAR (variable) controls, thereby displaying the pulse waveform over several divisions of the CRT screen. Most oscilloscope CRT screens have a special 5 division graticule lines to which the pulse amplitude is precisely adjusted for pulse risetime measurement. Second step 112 is to set Time/Div and trigger Level and Slope controls and switches so as to display the pulse rising edge to be measured between 5 to 10 divisions on the CRT screen. In third step 113, two vertical cursors are displayed by connecting $T_1$ to switching circuit 34 and $T_2$ to circuit 18. Fourth and fifth steps 114 and 115 are to control both $P_1$ and $P_2$ so that reference cursor (Cr) and delta cursor (Cd) are aligned respectively with 10% and 90% points of the waveform W. The distance between the Cr and Cd is then determined by either of the two methods previously described for step 105. The final step 117 is to multiply time/div setting by the determined distance between the cursors to obtain the intended risetime tr.

It should be noted that various time measurements such as pulse width, period, fall time, etc. may be made by using the two cursor measurement technique. Be sure that the Time/Div variable (VAR) knob is in its calibrated (CAL) position during the time measurement. However, the Volts/Div VAR knob may be any desired setting with the time measurement accuracy unaffected. The 10% and 90% points in the risetime and/or fall time measurement must be determined from the CRT graticule scale. Incorrect setting will cause measurement error.

Relative Amplitude and Time Measurement

There are many instances where only the ratio of amplitude or time of a test signal, or a portion of a reference signal, compared with specific reference points on a reference signal, is desired, whatever the actual or absolute values may be. For instance, relative amplitude information is necessary to analyze frequency response of passive or active circuits when the input signal frequency thereto is varied over a certain range. Duty cycle or the ratio of pulse width in one complete period of a repetitive pulse signal is another example to which relative measurement is effective. Examples of such relative amplitude and time measurement are described hereinafter.

Figure 4C:
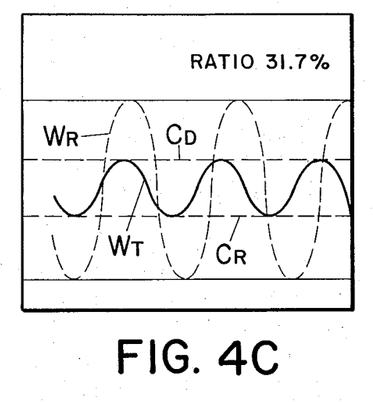
Figure 5C:
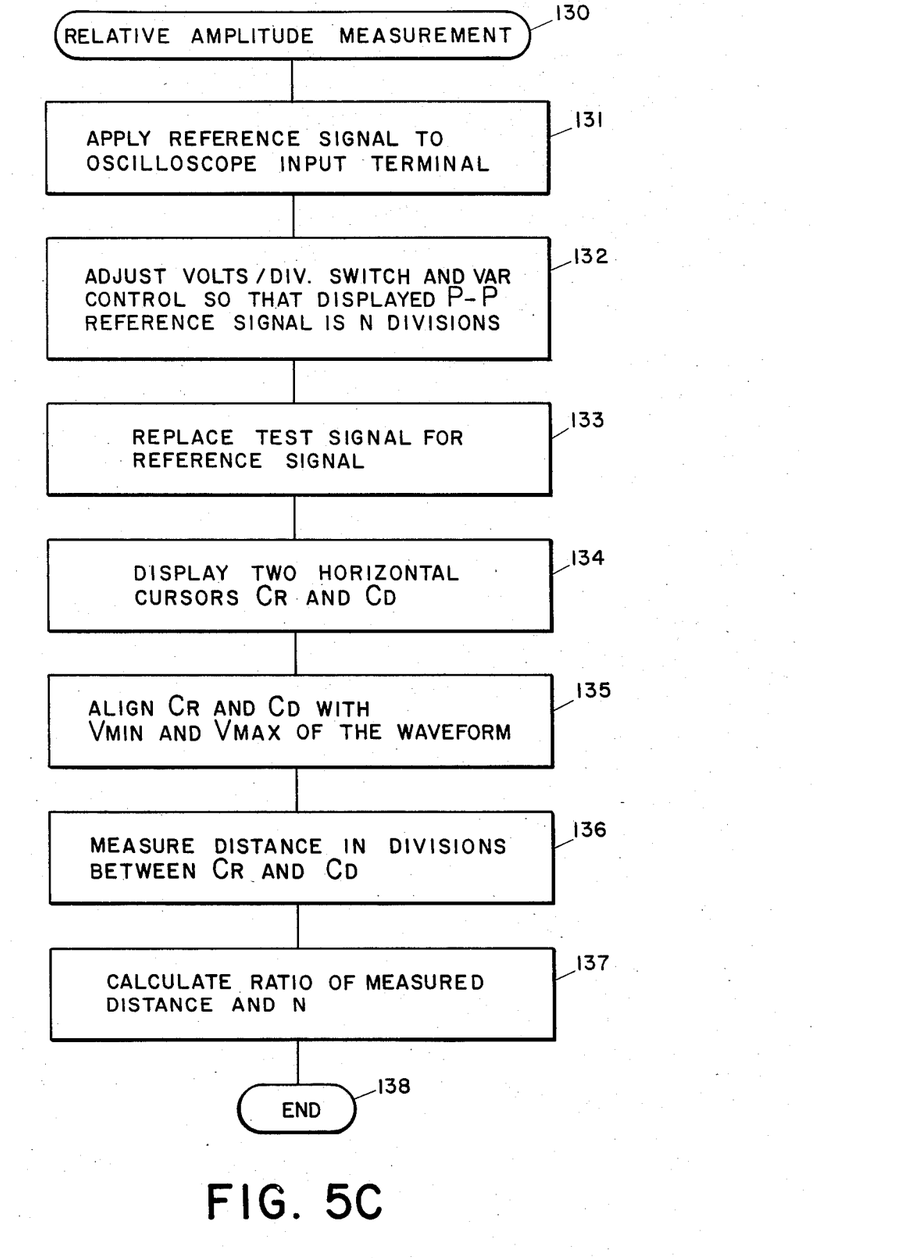

Relative Amplitude Measurement:

One example of relative amplitude measurement is graphically shown in FIG. 4C and also in FIG. 5C as a flow chart. First step 131 is to apply a reference signal to oscilloscope input terminal 10. In second step 132, Volts/Div switch and VAR control knob are adjusted so that the displayed peak-to-peak reference signal is N divisions (where N may be any predetermined number, but preferably five in typical eight vertical division oscilloscopes). Third step 133 is to replace a test signal for the reference signal. Special caution should be taken so that the Volts/Div switch and VAR control knob are unchanged for the remainder of the measurement. Two horizontal cursors Cr and Cd are displayed by connecting terminals $T_1$ and $T_2$ respectively to switching circuits 18 and 34 in fourth step 134. Fifth step 135 is to align Cr and Cd with the minimum and maximum waveform levels Vmin and Vmax, respectively, by controlling respective cursor voltage generator described hereinbefore. In sixth step 136, the distance in divisions (X) between Cr and Cd is measured by using DVM 42 and the predetermined deflection factor of the cursor signals or by reference to calibration data within the controller 38 that drives the DAC. In final step 137, the ratio X/N is calculated by a $\mu P$ or some other computing means. The result may digitally be displayed at the periphery of the CRT screen in percent. In this way, frequency response or other relative quantities may easily be obtained. If the reference signal is adjusted to a predetermined number of divisions, the relative amplitude may be measured continuously by switching a plurality of test signals or by selecting different test parameters. The tracking mode of cursor generator 40 is very convenient for GO-NO GO testing to determine if the test signal is within a predetermined limit because both cursors can be shifted vertically by single control of the reference cursor rather than independent control of the two cursors.

Figure 4D:
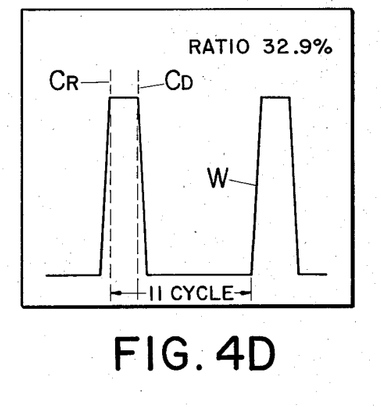
Figure 5D:
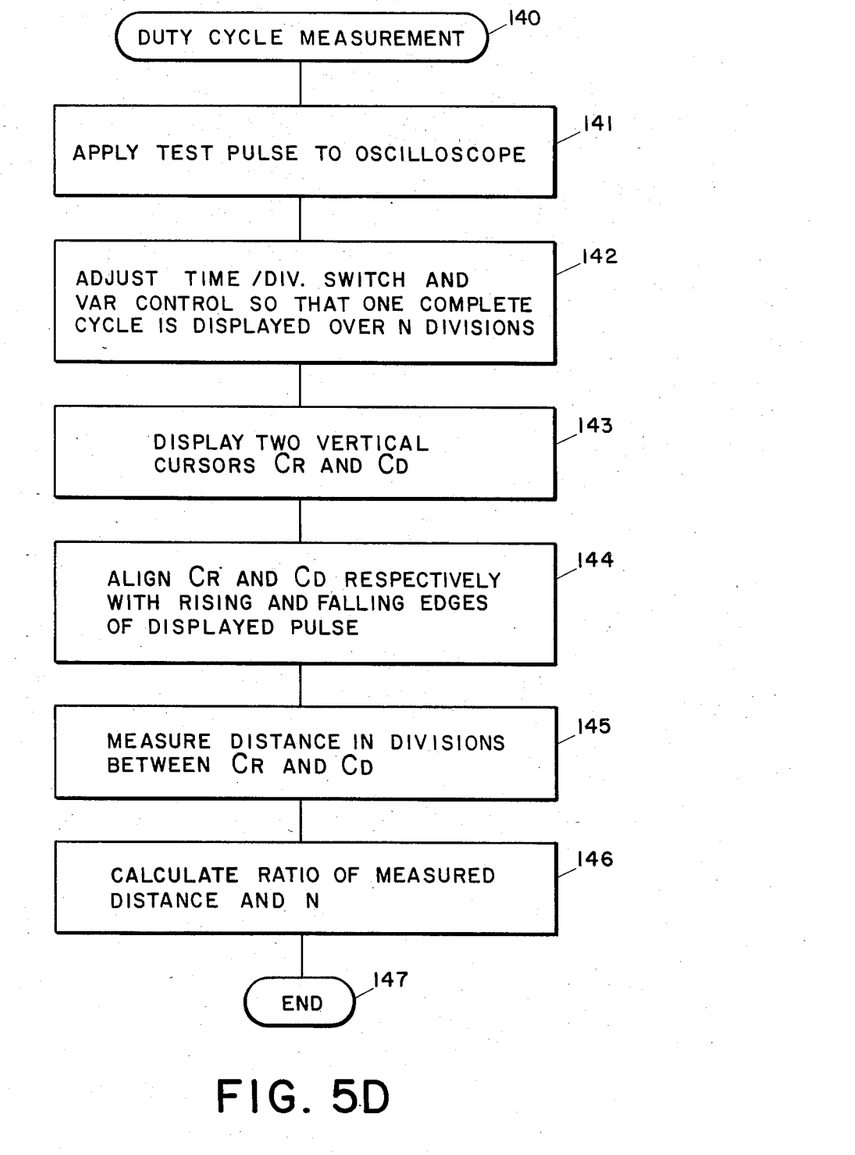

Duty Cycle Measurement:

FIG. 4D and FIG. 5D show an example of duty cycle measurement of pulse waveform graphically and by a flow chart, respectively. First, a test pulse is applied to input terminal 10 of an oscilloscope in first step 141. Then, the Time/Div switch and the VAR control knob are adjusted so that one complete cycle of the test signal is displayed over N (e.g., five) CRT graticule divisions in second step 142. Since the timebase or sweep ramp signal is linear over the entire CRT screen, the result is the same regardless of which part of the CRT screen is used for the adjustment. In third step 143, two vertical cursors (Cr and Cd) are displayed simultaneously on the CRT screen in a time sharing manner. The Cr and Cd are aligned with the rising and falling edges of the displayed pulse in fourth step 144. Then, in fifth step 145, the distance between Cr and Cd is determined by DVM 42 and predetermined deflection factor or by calibration data in the controller 38. Finally, in sixth step 146, the ratio of measured distance and N is calculated by computing means such as a $\mu P$. Since the maximum ramp voltage to deflect the electron beam over the full CRT graticule divisions remains constant despite standard or variable mode of the timebase, the voltage needed for N divisions of horizontal deflection is constant. Provided that the maximum ramp voltage for full (10) horizontal divisions is Vm and N is chosen to be five, the reference voltage is equal to Vm/2. Duty cycle can easily be obtained by calculating the voltage difference between the two cursors divided by Vm/2.

As may be understood from the foregoing description and accompanying drawings, the method of digitally measuring waveform effectively solves the disadvantages of conventional methods in that meaningful digital readouts are always provided either in absolute or relative values in both standard (CAL) or variable positions of vertical sensitivity and horizontal sweep rate, thereby avoiding any measurement errors. In addition, the use of tracking and independent operating modes of the cursor generator is very convenient, especially for time measurement when a waveform portion of interest may frequently shift, depending on trigger level slope settings, and the difference voltage between the two cursors can be obtained by measuring a single voltage.

Although the above description was made on preferred embodiments and particular applications, it will be understood by those having ordinary skill in the art that various modifications and changes may be made without departing from the present invention in its broader aspects.

What we claim as being novel is:

1. A method of digitally measuring a waveform display, comprising the steps of:
    (a) adjusting the separation of a first pair of selected points on a waveform to a predetermined reference spacing by using a variable control;
    (b) aligning first and second cursors with respective ones of a second pair of selected points on a waveform thereby to provide a measurement spacing; and
    (c) determining by digital measurement means the ratio of said measurement spacing to said reference spacing.

2. A method in accordance with claim 1 wherein said step of aligning said cursors includes controlling said cursors in one of an independent mode and a tracking mode.

3. A method in accordance with claim 1 wherein said ratio may be expressed as a percentage and displayed in numeric characters with a waveform.

4. A method of digitally measuring a waveform displayed on a display device, comprising the steps of:
    (a) aligning first and second cursors with respective ones of a pair of selected points on said waveform;
    (b) measuring electronically the distance between said first and second cursors;
    (c) electronically determining whether the scale factor of said display device in a standard condition or a variable condition; and
    (d) indicating the measured distance between said first and second cursors as an absolute value if the scale factor of said display device is in a standard condition, and as a ratio of the measured distance to a predetermined reference distance if said scale factor is in a variable condition.

5. A method of digitally measuring a waveform display, comprising the steps of:
    (a) aligning first and second cursors with respective ones of a pair of reference points of a display;
    (b) electronically measuring the distance between said reference points thereby to provide a reference distance;
    (c) aligning said first and second cursors with respective ones of a pair of selected points of a display;
    (d) electronically measuring the distance between said selected points thereby to provide a measurement distance; and
    (e) electronically calculating the ratio of the measurement distance to the reference distance.

* * * * *